US009941459B2

(12) United States Patent
Abdo

(10) Patent No.: US 9,941,459 B2
(45) Date of Patent: Apr. 10, 2018

(54) HIGH FIDELITY AND HIGH EFFICIENCY QUBIT READOUT SCHEME

(71) Applicant: INTERNATIONAL BUSINESS MACHINES CORPORATION, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/495,220

(22) Filed: Apr. 24, 2017

(65) Prior Publication Data

US 2017/0222116 A1 Aug. 3, 2017

Related U.S. Application Data

(60) Division of application No. 15/414,940, filed on Jan. 25, 2017, which is a continuation of application No. (Continued)

(51) Int. Cl.
*G08B 1/08* (2006.01)
*H01L 39/02* (2006.01)
(Continued)

(52) U.S. Cl.
CPC ......... *H01L 39/025* (2013.01); *G06N 99/002* (2013.01); *H01L 39/223* (2013.01);
(Continued)

(58) Field of Classification Search
CPC ................................. H01S 1/00; H01P 1/00
See application file for complete search history.

(56) References Cited

U.S. PATENT DOCUMENTS

2008/0197946 A1* 8/2008 Houck ............... B81B 3/0059
333/243
2010/0321117 A1* 12/2010 Gan .................. G04F 5/145
331/3

(Continued)

OTHER PUBLICATIONS

Baleegh Abdo, "Low-Loss Infrared Filter for Microwave Measurement Which Integrates a Distributed Bragg Reflector Into a Microwave Transmission Line", U.S. Appl. No. 14/867,326, filed Sep. 28, 2015.

(Continued)

*Primary Examiner* — Shirley Lu
(74) *Attorney, Agent, or Firm* — Cantor Colburn LLP; Vazken Alexanian

(57) ABSTRACT

A technique relates to a qubit readout system. A cavity-qubit system has a qubit and a readout resonator and outputs a readout signal. A lossless superconducting circulator is configured to receive the microwave readout signal from the cavity-qubit system and transmit the microwave readout signal according to a rotation. A quantum limited directional amplifier amplifies the readout signal. A directional coupler is connected to and biases the amplifier to set a working point. A microwave bandpass filter transmits in a microwave frequency band by passing the readout signal while blocking electromagnetic radiation outside of the microwave frequency band. A low-loss infrared filter has a distributed Bragg reflector integrated into a transmission line. The low-loss filter is configured to block infrared electromagnetic radiation while passing the microwave readout signal. The low-loss infrared filter is connected to the microwave bandpass filter to receive input of the microwave readout signal.

20 Claims, 8 Drawing Sheets

Related U.S. Application Data

14/867,342, filed on Sep. 28, 2015, now Pat. No. 9,589,236.

(51) Int. Cl.
 *H01L 39/22* (2006.01)
 *H01P 1/38* (2006.01)
 *H01P 1/20* (2006.01)
 *H01P 3/08* (2006.01)
 *H01P 5/18* (2006.01)
 *G06N 99/00* (2010.01)

(52) U.S. Cl.
 CPC .................. *H01P 1/20* (2013.01); *H01P 1/38* (2013.01); *H01P 3/08* (2013.01); *H01P 5/184* (2013.01)

(56) References Cited

U.S. PATENT DOCUMENTS

| | | | | |
|---|---|---|---|---|
| 2012/0272741 A1* | 11/2012 | Xiao | ................. | G01B 7/16 73/774 |
| 2014/0125990 A1* | 5/2014 | Hinderling | ............. | G02B 5/284 356/496 |
| 2014/0218792 A1* | 8/2014 | Krogman | ................ | B32B 15/08 359/359 |
| 2015/0022564 A1* | 1/2015 | Zhang | ................... | G02F 1/1347 345/690 |

OTHER PUBLICATIONS

Baleegh Abdo, "High Fidelity and High Efficiency Qubit Readout Scheme," U.S. Appl. No. 15/414,940, filed Jan. 25, 2017.

Baleegh Abdo, "High Fidelity and High Efficiency Qubit Readout Scheme," U.S. Appl. No. 14/867,342, filed Sep. 28, 2015, U.S. Pat. No. 9,589,236, Mar. 7, 2017.

Baleegh Abdo,"High Fidelity and High Efficiency Qubit Readout Scheme", U.S. Appl. No. 14/950,349, filed Nov. 24, 2015, U.S. Pat. No. 9,691,962, Mar. Jun. 27, 2017.

Baleegh Abdo,"Low-Loss Infrared Filter for Microwave Measurement Which Integrates a Distributed Bragg Reflector Into a Microwave Transmission Line", U.S. Appl. No. 14/950,333, filed Nov. 24, 2015.

List of IBM Patents or Patent Applications Treated as Related filed: Aug. 7, 2017, pp. 1-2.

* cited by examiner

HIGH FIDELITY AND HIGH EFFICIENCY QUBIT READOUT SCHEME

DOMESTIC PRIORITY

This application is a divisional of U.S. patent application Ser. No. 15/414,940 filed on Jan. 25, 2017, entitled "HIGH FIDELITY AND HIGH EFFICIENCY QUBIT READOUT SCHEME" which is a continuation of U.S. Pat. No. 9,589,236 issued Mar. 7, 2017, entitled "HIGH FIDELITY AND HIGH EFFICIENCY QUBIT READOUT SCHEME", the entire contents of which are incorporated herein by reference.

BACKGROUND

The present invention relates to measurement techniques of sensitive quantum systems operating in the microwave domain, such as superconducting quantum circuits, which require for their measurement, high gain, low-noise output chains that also provide sufficient protection to the measured systems against noise and more specifically, to a high fidelity and high efficiency qubit readout scheme.

In one approach called circuit quantum electrodynamics, quantum computing employs nonlinear superconducting devices called qubits to manipulate and store quantum information, and resonators (e.g., as a two-dimensional (2D) planar waveguide or as a three-dimensional (3D) microwave cavity) to read out and facilitate interaction among qubits. As one example, each superconducting qubit may comprise one or more Josephson junctions shunted by capacitors in parallel with the junctions. The qubits are capacitively coupled to 2D or 3D microwave cavities. The electromagnetic energy associated with the qubit is stored in the Josephson junctions and in the capacitive and inductive elements forming the qubit. To date, a major focus has been on improving lifetimes of the qubits in order to allow calculations (i.e., manipulation and readout) to take place before the information is lost due to decoherence of the qubits. Currently, the coherence times of superconducting qubits can be as high as 100 microseconds, and efforts are being made to increase their coherence times.

SUMMARY

According to one embodiment, a qubit readout system is provided. A cavity-qubit system includes a qubit and a readout resonator, where the cavity-qubit system is configured to output a microwave readout signal. A lossless superconducting circulator is configured to receive the microwave readout signal from the cavity-qubit system and transmit the microwave readout signal according to a rotation. A quantum limited directional amplifier in which amplification takes place in one direction, and the quantum limited directional amplifier is configured to amplify the microwave readout signal. A directional coupler operatively connected to the quantum limited directional amplifier, and the directional coupler is configured to enable biasing of the quantum limited directional amplifier to set a working point. A microwave bandpass filter configured to transmit in a microwave frequency band, and the microwave bandpass filter is configured to pass the microwave readout signal while blocking electromagnetic radiation outside of the microwave frequency band. The microwave bandpass filter is operatively connected to the quantum limited directional amplifier to receive input of the microwave readout signal. A low-loss infrared filter has a distributed Bragg reflector integrated into a transmission line, and the low-loss filter is configured to block infrared electromagnetic radiation while passing the microwave readout signal. The low-loss infrared filter is operatively connected to the microwave bandpass filter to receive input of the microwave readout signal.

According to one embodiment, a method of configuring a microwave apparatus is provided. The method includes providing a cavity-qubit system comprising a qubit and a readout resonator, where the cavity-qubit system is configured to output a microwave readout signal. The method includes configuring a lossless superconducting circulator to receive the microwave readout signal from the cavity-qubit system and transmit the microwave readout signal according to a rotation and connecting a quantum limited directional amplifier to amplify the microwave readout signal, such that amplification takes place in one direction. Also, the method includes connecting a directional coupler to the quantum limited directional amplifier, where the directional coupler is configured to enable biasing of at least one of the quantum limited directional amplifier and the lossless superconducting circulator to set a working point and connecting a microwave bandpass filter configured to transmit in a microwave frequency band, where the microwave bandpass filter is configured to pass the microwave readout signal while blocking electromagnetic radiation outside of the microwave frequency band. The microwave bandpass filter is operatively connected to the quantum limited directional amplifier to receive input of the microwave readout signal. Further, the method includes configuring a low-loss infrared filter having a distributed Bragg reflector integrated into a transmission line, where the low-loss infrared filter is configured to block infrared electromagnetic radiation while passing the microwave readout signal, and where the low-loss infrared filter is operatively connected to the microwave bandpass filter to receive input of the microwave readout signal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
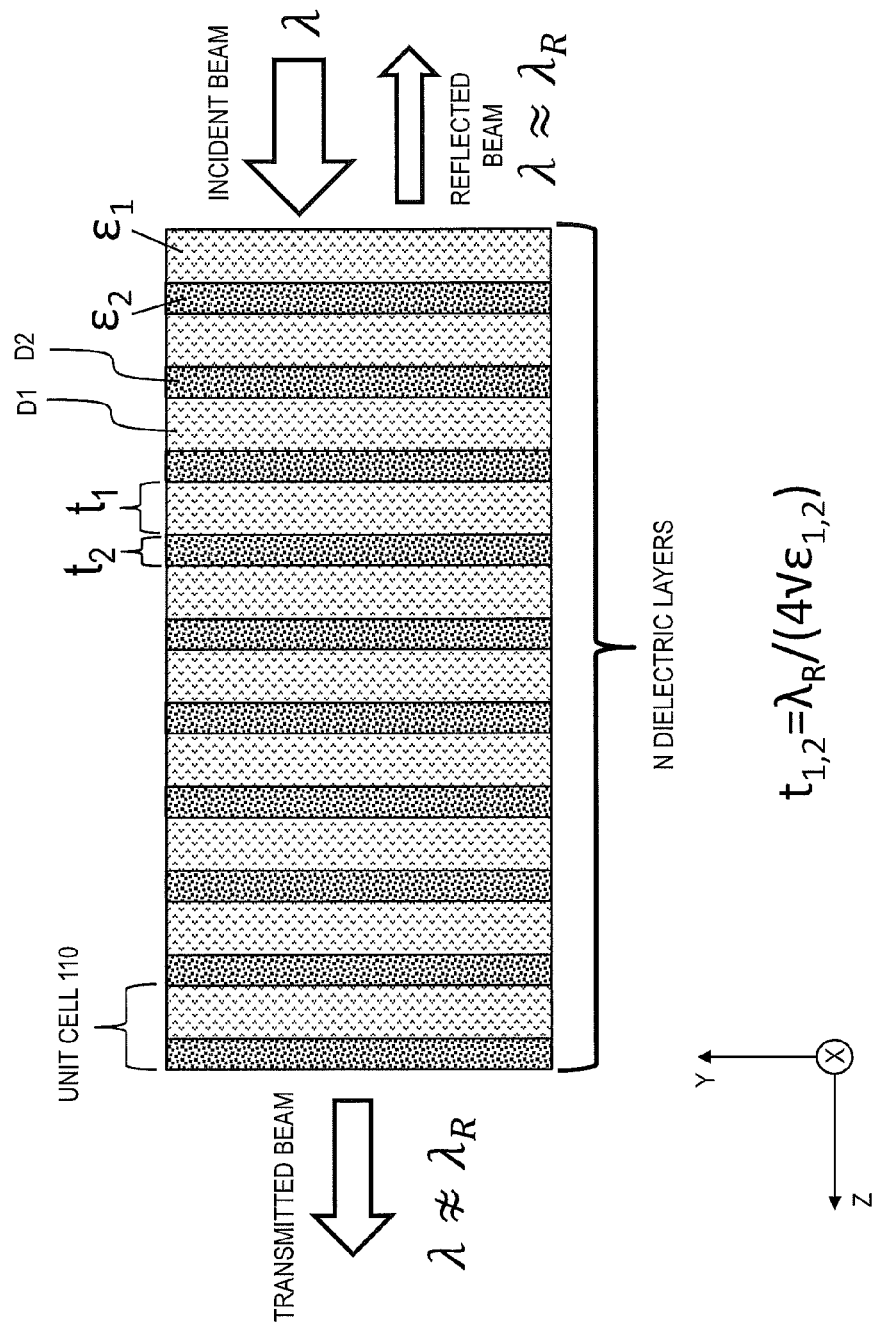
FIG. 1 is a cross-sectional view of a distributed Bragg reflector to be utilized according to an embodiment.

According to an embodiment, the proposed qubit readout scheme can be used to perform high fidelity and high efficiency quantum measurements in the microwave domain, and particularly for the purpose of measuring the quantum state of solid state qubits such as superconducting qubits and quantum dots. An embodiment may be based on physics and microwave devices. A few particular microwave components may include: 1) a lossless on-chip circulator (lossless circulator), 2) a quantum-limited Josephson directional amplifier, 3) a bandpass filter, and 4) a low-loss infrared filter. None of these components, when examined separately, meet the requirements of high fidelity and high efficiency quantum measurements. According to an embodiment, an architecture/setup is disclosed that presents a measurement chain, and the measurement chain combines components/devices in order to perform high fidelity and high efficiency quantum measurements. A benefit of this measurement chain is that most of its components can be integrated on chip as part of a quantum processor or as a separate unit.

Quantum systems such as superconducting qubits are very sensitive to electromagnetic noise, in particular in the microwave and infrared domains. In order to protect these quantum systems from microwave and infrared noise, several layers of filtering, attenuation, and isolation are applied. Of particular interest are the layers of protection employed on the input and output (I/O) lines, also called transmission lines, that are connected to the quantum system, and carry the input and output signals to and from the quantum system respectively.

In the case of superconducting qubits, these I/O lines (transmission lines) are microwave coaxial lines or waveguides. Some of the techniques or components that are used in order to block or attenuate the noise propagating or leaking into these transmission lines are attenuators, circulators, isolators, lowpass microwave filters, bandpass microwave filters, and infrared filters which are based on lossy absorptive materials. However, using these lossy infrared filters on the output line is undesirable because the lossy infrared filters considerably degrade the signal-to-noise ratio (SNR) of the microwave signal that is used in the measurement of the quantum system.

Embodiments are configured to realize a low-loss infrared filter. The low-loss infrared filter blocks infrared radiation in the unwanted band that can negatively affect the quantum system, while simultaneously allowing microwave signals (e.g., (microwave) band 1-15 GHz commonly used for qubit readout and measurement) to be transmitted through the infrared filter with minimum loss.

Ideally, superconducting qubits need to be completely protected and isolated from unwanted electromagnetic signals and noise irradiated at them from the environment or carried by the input and output lines coupled to them. One example of such unwanted noise is blackbody radiation coming down the input and output lines which originates from room-temperature equipment or microwave components that reside at higher stages in the dilution fridge such as the 4 kelvin (K) plate. Hence, the spectrum of noise which qubits need to be protected against can be very broad extending from tens of gigahertz to tens or even hundreds of terahertz.

To better understand the spectrum of thermal noise that is most relevant to the noise carried by the input and output lines which pass through the different temperature stages of a dilution fridge, consider the simple case of a resistor R at temperature T The RMS (root mean square) voltage created at the terminals of the resistor due to thermal noise is given by Planck's blackbody radiation law, $$V_n^{rms} = \sqrt{\frac{4hfBR}{e^{hf/kT} - 1}},$$

where h is Planck's constant, k is Boltzmann's constant, B is the bandwidth of the system, and f is the frequency of the noise within the bandwidth B. Furthermore, the maximum available noise power from this noisy resistor is obtained by connecting it to a load of equal resistance $$P_n = \left(\frac{V_n^{rms}}{2R}\right)^2 R,$$

which gives $$P_n = \frac{hfB}{e^{hf/kT} - 1}.$$

Although, this expression for $P_n$ does not exactly describe the noise entering the qubit system, mainly because the qubit is not a load of resistance R and it is not directly coupled to the input and output lines (i.e. it is dispersively coupled to a resonator which in turn is coupled to the input and output lines), this expression for $P_n$ shows however in a rather simple manner the interrelationship between the temperature of a resistor and the resultant noise spectrum.

The low-loss infrared filter in embodiments may be utilized in the readout of solid state qubits such as superconducting qubits or quantum dots, and may also be utilized in the readout of any quantum system working in the microwave domain which requires protection from infrared radiation in a certain bandwidth. For example, the low-loss infrared filter may be used on the output lines of qubits in order to protect their quantum state from infrared radiation in a certain bandwidth coming down the output line from higher temperature stages without degrading the signal-to-noise ratio of the output microwave signal measuring the qubit.

Also, embodiments may be applied to improve the sensitivity of microwave measurements in the areas of astronomy and cosmology, and the low-loss infrared filter may be utilized in the transmission lines of the microwave systems in these areas.

In microwave quantum systems such as superconducting qubits, $T_1$ refers to the "relaxation time" of the qubit, which in turn represents the characteristic time over which the qubit loses its energy to various intrinsic and extrinsic dissipation mechanisms in the qubit circuit and the environment. In other words, $T_1$ is a measure of how long it takes for the excited state of the qubit to decay to the ground state. $T_2$ is called the "phase coherence time" of the qubit. $T_2$ is a measure of how long the qubit maintains coherence in a phase that is predictable.

Infrared photons can decrease $T_2$ of superconducting qubits (and also $T_1$ for example by generating non-equilibrium quasiparticles in the device). The qubit-cavity system (where cavity usually refers to a superconducting microwave cavity) can be enclosed inside a black infrared-tight can, but the input and output coaxial lines of the qubit can still carry infrared photons. Some of the potential infrared radiation sources in a dilution fridge include, the blackbody radiation of the 4 kelvin (K) stage, high frequency noise originating from the amplification chain especially the HEMT amplifier which is commonly used in such experiments and mounted on the 4 K stage, thermal noise generated by the electronic equipment at room-temperature which is used to control the qubit and read out its quantum state, and heat sources on the various stages such as heaters, or microwave components that are not thermalized well.

Some issues concerning lossy infrared filters were discussed above. A few examples of lossy infrared filters may include copper-powder filters, resistive RLC meander line on-chip, eccosorb filters, slot lines in coaxial, and silver-epoxy filters. All of these examples of infrared filters are based on lossy materials. In general, the signal attenuation in these filters increases as the frequency increases. The addition of a lossy infrared filter to an input line of a qubit adds to the total attenuation of the line. However adding it to the output line can considerably degrade the SNR of the measurement of the microwave readout signal. Furthermore, these lossy infrared filters are not very well matched to the standard 50 ohm ($\Omega$) measurement environment, and this mismatch causes multiple reflections in the lines and ripples in the microwave output signal (versus frequency). These lossy infrared filters can have about a 5-20 decibel (dB) loss at the readout frequency.

According to an embodiment, a microwave apparatus is provided that includes a microwave system. The microwave system has an input and an output connected to low-loss infrared filters which in turn connect to input and output microwave transmission lines. The input and output microwave transmission lines carry microwave signals into and out of the microwave system and carry in addition unwanted infrared radiation. The low-loss infrared filters which consist of distributed Bragg reflectors integrated into a transmission line configuration allow the input and output microwave signals to be transmitted into and out of the microwave system with little attenuation (e.g., below 2 dB) while blocking the unwanted infrared radiation in a certain bandwidth from reaching the microwave system.

Now, turning to the low-loss infrared filter, FIG. 1 is a cross-sectional view of a distributed Bragg reflector 100 to be utilized according to an embodiment. The distributed Bragg reflector 100 is a periodic structure which consists of N layers of dielectric materials, where N is the total number of layers. The unit cell 110 of this periodic structure comprises two different dielectric layers D1 and D2. In this example, dielectric layer D1 has a first thickness $t_1$ and dielectric layer D2 has a second thickness $t_2$. The dielectric layers D1 and D2 are adjacent to one another.

The dielectric layer D1 has a dielectric constant $\in_1$ and the dielectric layer D2 has a dielectric constant $\in_2$. The dielectric constants $\in_1$ and $\in_2$ are different values from one another. The combination of dielectric layers D1 and D2 is designed to reflect a center wavelength denoted as $\lambda_R$ (i.e., corresponding to a center frequency $f_R$), where R refers to the reflection coefficient for the electric field.

Given a particular dielectric constants $\in_1$ and $\in_2$ for the respective dielectric layers D1 and D2, the following formulas can be utilized to determine the respective thickness (e.g., in the z-axis) for each dielectric layer D1 and D2.

For dielectric layer D1, the thickness $t_1=\lambda_R/(4\sqrt{\in_1})$. For dielectric layer D2, the thickness $t_2=\lambda_R/(4\sqrt{\in_2})$. When an electromagnetic wave or beam is incident on the periodic structure, part of the beam is reflected back at the boundaries of the alternating dielectric layers due to impedance mismatch, while the remaining part gets transmitted. By accounting for all these multiple reflections and transmissions, it is possible to define a reflection parameter R and transmission parameter T for the whole structure, which satisfy the energy conservation condition, $|R|^2+|T|^2=1$. In the special case, where the wavelengths of the incident electromagnetic waves in the different layers are equal to about 4 times the thicknesses of the layers, the multiple reflections at the various boundaries constructively interfere together and result in total reflection of the waves. Thus, the range of frequencies around the center frequency $f_R$ for which the periodic structure acts as a perfect reflector defines the bandwidth of the device or in other words the bandwidth of the photonic stopband of the device.

Figure 2:
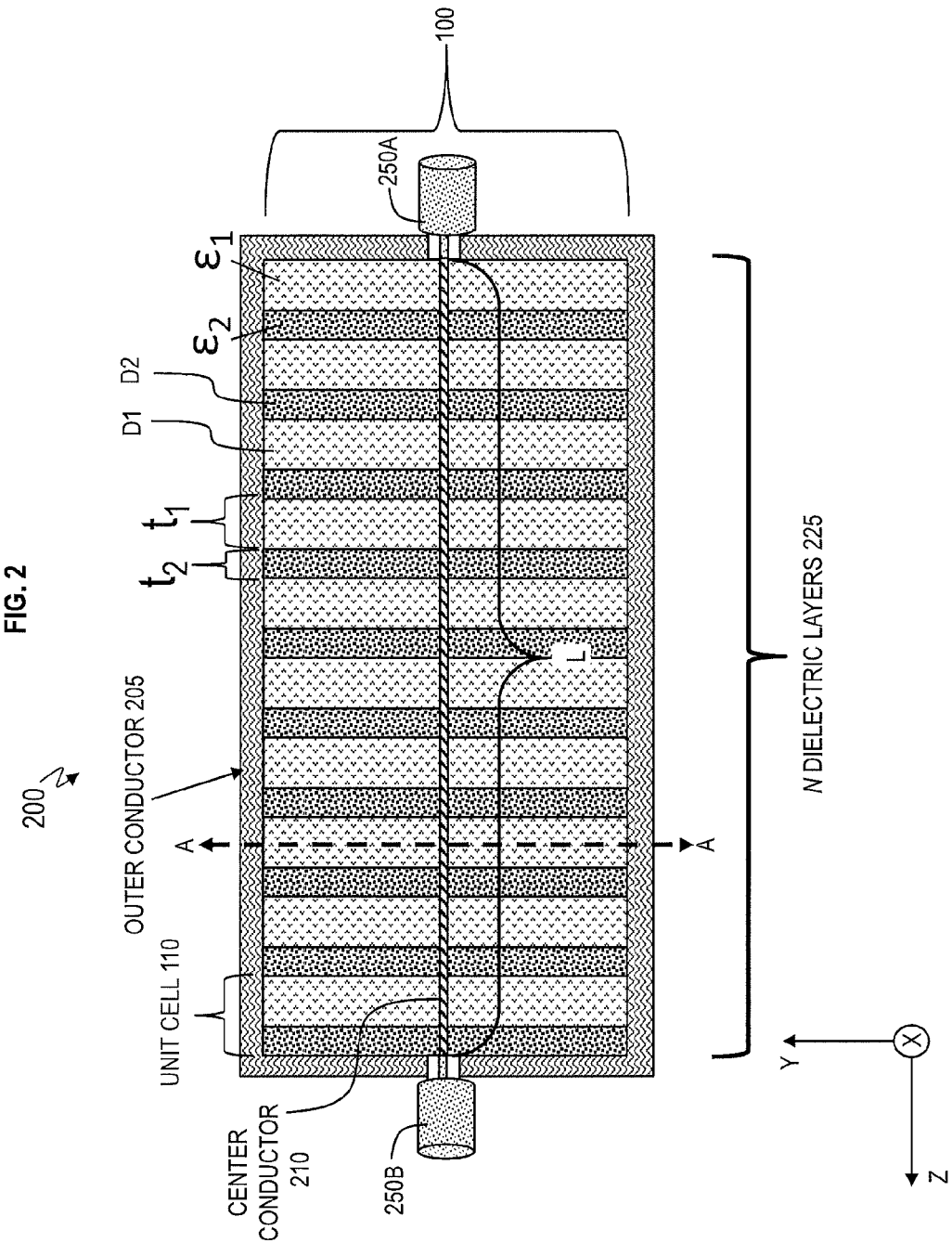
FIG. 2 is a schematic of a low-loss infrared filter implemented as a distributed Bragg reflector integrated into a stripline geometry according to an embodiment.

FIG. 2 is a schematic of a low-loss infrared filter 200 implemented to include the distributed Bragg reflector 100 in a stripline geometry according to an embodiment. The low-loss infrared filter 200 is matched to 50 ohms in the 5-15 GHz microwave band that is commonly used for qubit readout, is low-loss in the 5-15 GHz band, and is reflective for infrared (IR) photons in an unwanted band.

The low-loss infrared filter 200 includes an outer conductor 205. The outer conductor 205 may be a three-dimensional rectangular copper box in one implementation. For example, the inner dimensions of the box (that house the alternating dielectric layers and the center conductor) can be about 25 mm, 4 mm, 10 mm, along the x, y, z axes respectively. The walls of the outer conductor 205 can be a few millimeters thick. The exact thickness of the enclosure can vary depending on the screws used to assemble the filter together and on the screws used in order to mount the filter in the fridge. The outer conductor 205 (e.g., copper box) comprises N (total) dielectric layers 225. In this implementation, the dielectric layers D1 and D2 are shown, and the dielectric layers D1 and D2 form the unit cell 110 in the N (total) dielectric layers 225. The multiple dielectric layers D1 and D2 repeat in the periodic arrangement within the outer conductor 205. In another implementation, the outer conductor 205 may be cylindrical instead of a rectangular.

A center conductor 210 extends, from end to end, through the center of the outer conductor 205. The center conductor 210 may be a thin copper stripline. The center conductor 210 and the outer conductor 205 respectively connect to connectors 250A and 250B at opposite ends of the device 200 for transmitting and receiving signals. Although copper (in particular, oxygen-free high thermal conductivity (OFHC) copper) may be utilized for the center conductor 210 and the outer conductor 205, other materials such as gold, and silver may also be utilized.

The connectors 250A and 250B may be any microwave connector, such as subminiature version A (SMA) connectors, K connectors, etc. In one implementation, the dielectric material in connectors 250A and 250B may be Teflon with a dielectric constant $\in=2.1$. The outer conductor of the connectors is connected to the outer conductor 205 of the filter 200, whereas the center conductor of the connectors is connected to the center conductor 210 of the filter 200.

In one implementation, the alternating dielectric layers D1 and D2 may be Si ($\in=11.8$) and $SiO_2$ ($\in=3.9$). In another implementation, the alternating dielectric layers D1 and D2 may be Si and $Si_3N_4$ ($\in=7.5$). Other well-characterized dielectric materials such as Ge ($\in$=16) and GaAs ($\in$=11-13) can also be considered as possible candidates. In general, the higher the contrast in dielectric constants between the alternating dielectric layers D1 and D2 (for the same number of layers N), the larger the reflection magnitude at the center frequency $f_R$ and also the broader the bandwidth of the reflection (i.e., the bandwidth of the photonic stopband). One simple way to see this dependence is by considering the simple expressions for the reflection magnitude $$|R^{DBR}|^2 = \left|\frac{n_2^N - n_1^N}{n_2^N + n_1^N}\right|^2$$

and the reflection bandwidth $$\Delta f_R^{DBR} = \frac{4}{\pi} f_R^{DBR} \sin^{-1}\left(\frac{n_2 - n_1}{n_2 + n_1}\right)$$

of a distributed Bragg reflector (DBR) that is not integrated into a transmission geometry and whose initial and final dielectric layers at the two ends of the N-layer stack are made of the same material, where $n_1$ and $n_2$ are the refraction indices of the alternating layers given by $n_1 = \sqrt{\in_1}$, $n_2 = \sqrt{\in_2}$, and $f_R^{DBR}$ is the center frequency of the reflected signal. For example, for a stack of N=20 alternating dielectric layers with dielectric constants $\in_1$=3.9 and $\in_2$=7.5, and $f_R^{DBR}$=83 GHz, we get $|R^{DBR}|^2$=0.96, and $\Delta f_R^{DBR}$=12 GHz, whereas with $\in_1$=3.9 and $\in_2$=11.8 we get $|R^{DBR}|^2$=0.9999, and $\Delta f_R^{DBR}$=29 GHz. Another observation that can be made from the above expressions is that the reflection magnitude $|R^{DBR}|^2$ can be made arbitrarily close to unity by increasing N; however the bandwidth of the DBR is mainly set by the dielectric constants of the materials used and is independent on N.

Based on these design guidelines discussed herein (or using an electromagnetic simulation tool), and given a certain $f_R$ and stopband bandwidth, embodiments provide principles to design a low-loss infrared filter 200 that reflects off signals in the unwanted frequency range while allowing microwave frequencies in the range of interest 5-15 GHz to get transmitted with little loss and little (or no) reflection. According to an embodiment, the design process involve choosing the type of dielectric layers D1 and D2, calculating the thicknesses of the dielectric layers D1 and D2, deciding on the number (N) of layers D1 and D2 employed, and determining the dimensions of the stripline cross-section such that the higher order transverse magnetic field (TM) and traverse electric (TE) field supported by the stripline are suppressed as much as possible.

In one implementation, it noted that one technique to effectively increase the stopband bandwidth of the infrared radiation beyond what is achievable for a certain choice of dielectric layers is by concatenating multiple low-loss infrared filters 200 which have different center frequencies $f_R$ and whose stopband bandwidths partially overlap.

One basic idea appreciated in the device 200 (which allows microwave signals in the frequency range of interest (i.e., 5-15 GHz for qubit readout) to be transmitted through the device 200 with little reflection, while reflecting off most of the infrared radiation around $f_R$ (i.e., the center frequency which the device is designed to block)) is the large difference in scale of the corresponding wavelengths of these two frequency ranges (i.e., the frequency range of interest and the range around the center frequency $f_R$) compared to the thicknesses of the alternating layers. While in the case of the infrared radiation to be reflected off, the corresponding wavelengths in each dielectric layer are about four times the thickness of the layer, in the case of the desired microwave signals the corresponding wavelengths in each dielectric layer are at least 30 times longer than the thickness of the layer. This difference in scale in the wavelengths of the incident signals causes the infrared radiation to be significantly more affected by the rapid variation of the dielectric layers D1 and D2 than the microwave signals of interest, which effectively propagate along the stripline loaded by the periodic Bragg structure with very little perturbation.

In one implementation, the distributed Bragg structure that is integrated into a transmission line geometry (stripline or coax) is mainly effective in reflecting off transverse electromagnetic (TEM) waves, and possibly transverse electric (TE) waves. The device may be less effective in reflecting off transverse magnetic (TM) waves. Two known microwave techniques that can be possibly applied in this device 200 in order to suppress higher TE and TM modes in the stripline geometry is by using shorting screws between the ground planes (the top and bottom outer conductors 205) and by limiting the ground plane spacing to less than quarter wavelength of $f_R$ according to an embodiment.

It is noted that the distributed Bragg reflector 100 is integrated into a transmission line which together form the filter 200. Particularly, the outer conductor 205 and the center conductor 210 with the dielectric material in between is a stripline geometry and it is a type of a transmission line.

Figure 3:
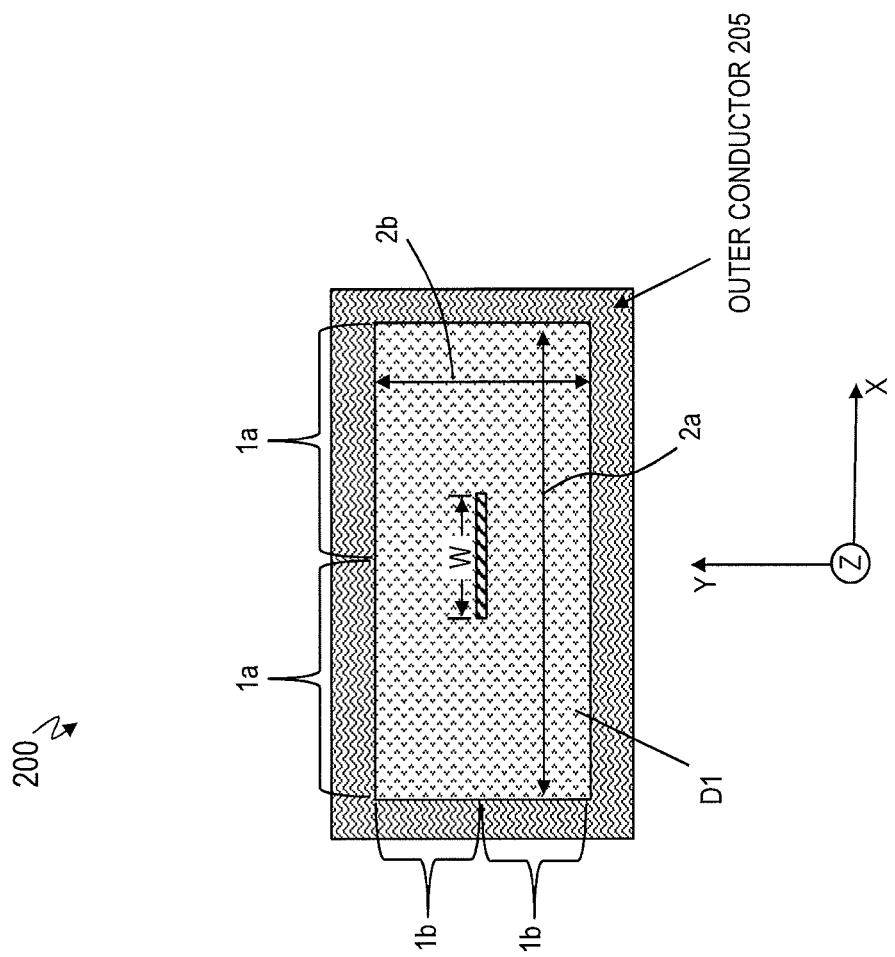
FIG. 3 is a cross-sectional view of the low-loss infrared filter according to an embodiment.

FIG. 3 is a cross-sectional view of the low-loss infrared filter 200 taken along line A-A according to an embodiment. FIG. 3 shows that the center conductor 210 has a width W in the x-axis.

Although only dielectric layer D1 is illustrated in the cross-sectional view of FIG. 3, the height of the dielectric layers D1 and D2 is height 2b in the y-axis. In particular, a height 1b extends up from the center of the dielectric layer D1 (dielectric layer D2 or center conductor 210) and another height 1b extends down. Given a certain choice of alternating dielectric layers D1 and D2 with dielectric constants $\in_1$ and $\in_2$ and corresponding thicknesses $t_1$ and $t_2$, it is possible to approximately evaluate the effective dielectric constant seen by microwave signals in the range of interest 5-15 GHz (which has relatively long wavelengths compared to $t_1$ and $t_2$) by using a weighted average given by $\in_{eff} \approx (\in_1 t_1 + \in_2 t_2)/(t_1+t_2)$. Combining this calculated value of effective dielectric constant $\in_{eff}$ with the requirement that the microwave signals in the range of interest see a characteristic impedance $Z_0$ of 50 Ohm, yields an estimate for the ratio W/2b. Therefore, the dimensions W and b of the device 200 are not independent of each other. The design formula that yields a relatively good estimate for the ratio W/2b is a known microwave textbook result given by $$\frac{W}{2b} = \begin{cases} x & \text{for } \sqrt{\varepsilon_{eff}} Z_0 < 120 \\ 0.85 - \sqrt{0.6 - x} & \text{for } \sqrt{\varepsilon_{eff}} Z_0 > 120 \end{cases}, \text{ where } x = \frac{30\pi}{\sqrt{\varepsilon_{eff}} Z_0} - 0.441.$$

Again, although only dielectric layer D1 is illustrated in the cross-sectional view of FIG. 3, the width of each of the dielectric layers D1 and D2 is 2a in the x-axis. In particular, a width 1a extends left from the center of the dielectric layer D1 (dielectric layer D2 or center conductor 210) and another width 1a extends right. The particular condition that the width 2a should satisfy is 2a>>2b so that the fields around the center conductor are not perturbed by the sidewalls.

Figure 4A:
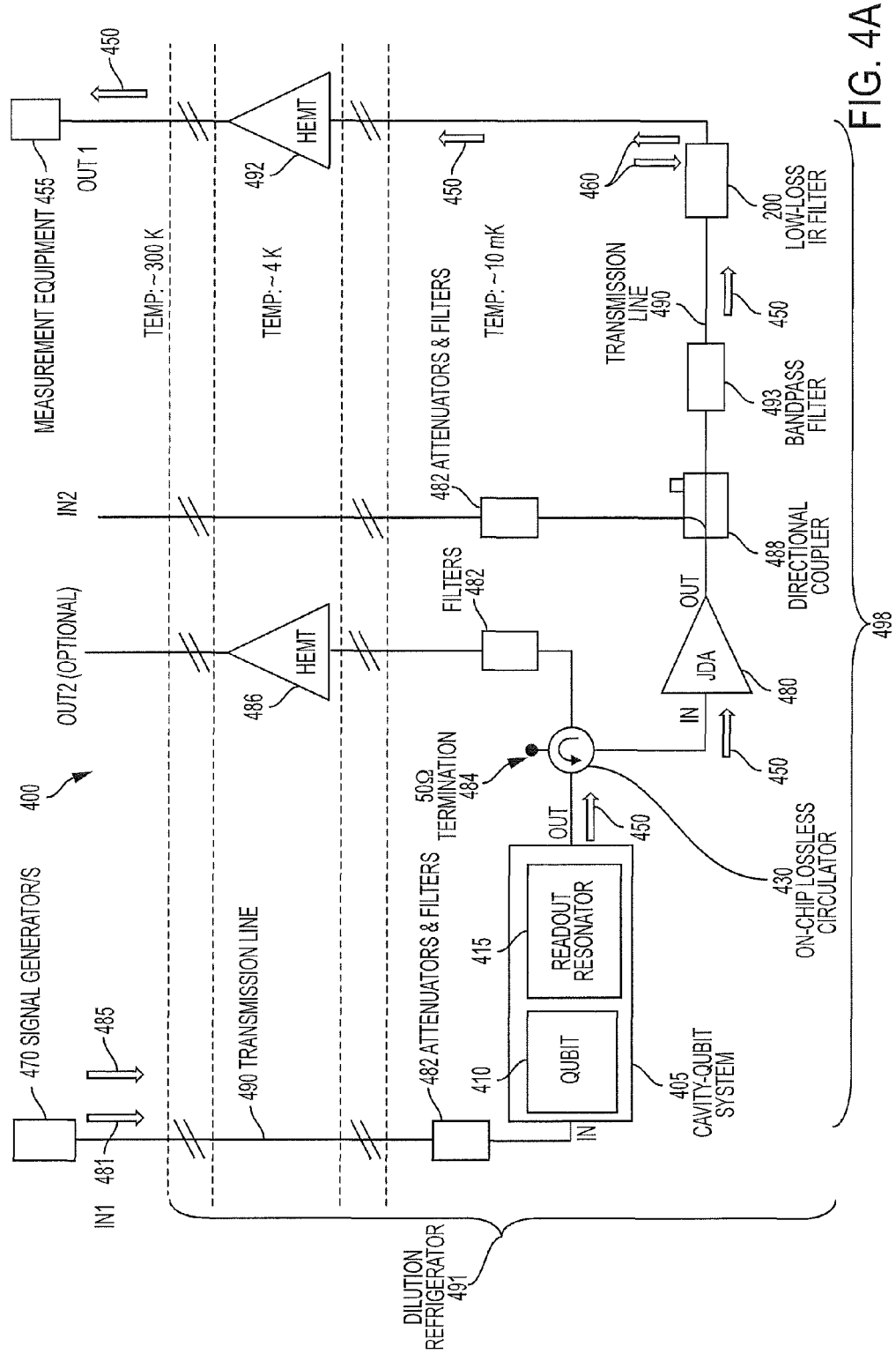
FIG. 4A is a schematic of an architecture/microwave apparatus incorporating the low-loss infrared filter according to an embodiment.
Figure 4B:
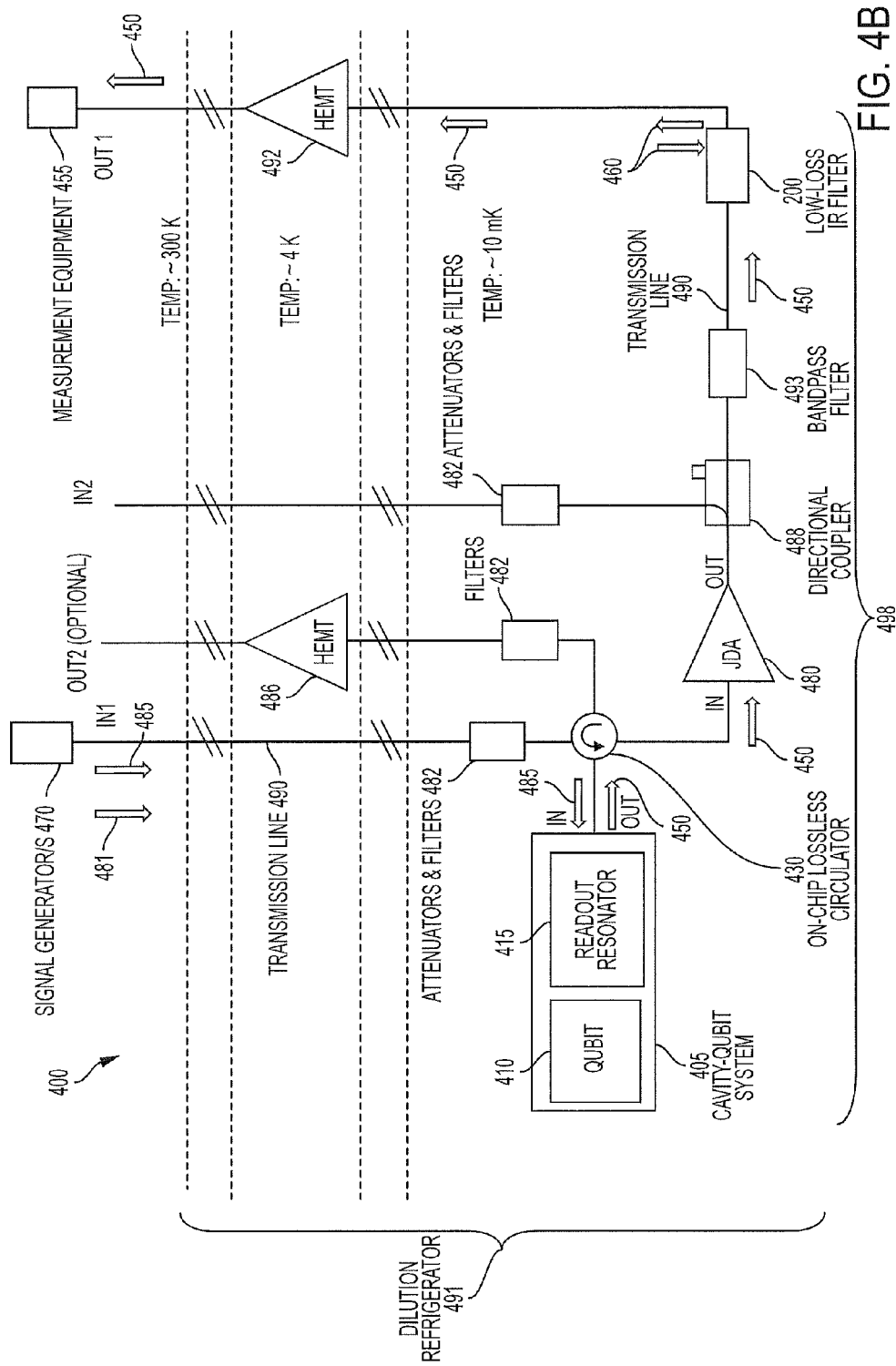
FIG. 4B is a schematic of an architecture/microwave apparatus incorporating the low-loss infrared filter according to another embodiment.

FIG. 4A is a schematic of an architecture/microwave apparatus 400 (qubit readout system) incorporating the low-loss infrared filter 200 and illustrates measurement of the quantum system in transmission according to an embodiment. FIG. 4B is a schematic of the architecture/microwave apparatus 400 (qubit readout system) incorporating the low-loss infrared filter 200 and illustrates measurement of the quantum system in reflection according to an embodiment. When the readout resonator works in transmission, the input and output signals do not share the same transmission line, and without loss of generality the input signal enters from the left and the output signal exits from the right as depicted in FIG. 4A. When the readout resonator works in reflection, both the input and output signals share the same transmission line as depicted in FIG. 4B.

The architecture/microwave apparatus 400 includes a superconducting cavity-qubit system 405. The superconducting cavity-qubit system 405 may include a two-dimensional (2D) microwave cavity or a three-dimensional (3D) microwave cavity.

The superconducting cavity-qubit system 405 includes a superconducting qubit 410 and a readout resonator 415 designed to read (i.e., probe) the state of the superconducting qubit 410. In one implementation, the superconducting qubit 410 may be a transmon qubit that includes a Josephson junction. The superconducting qubit 410 may be capacitively coupled to the readout resonator 415. The readout resonator 415 may include an inductor and capacitor, coplanar waveguide resonator, and/or coplanar strip line resonator. Note that although the superconducting qubit 410 may be a transmon qubit circuit for explanation purposes, it is understood that the superconducting qubit 410 is not meant to be limited and applies to other superconducting qubits circuits that are not transmon qubit circuits.

The input side and output side of the superconducting cavity-qubit system 405 are connected to transmission lines 490. An on-chip superconducting (lossless) circulator 430 is connected to the cavity-qubit systems 405. After a signal is input into/received by one port of the on-chip superconducting circulator 430, the signal is output through the next port after rotating counter clockwise (i.e., in the direction of the arrow). The on-chip superconducting circulator 430 may have three or four ports. This example shows the on-chip superconducting circulator 430 with the first port connected to the output of the cavity-qubit system 405. The second port of the on-chip superconducting circulator 430 is connected to a quantum limited Josephson directional amplifier (JDA) 480. The third port of the on-chip superconducting circulator 430 is connected to one or more filters 482 at the mixing chamber and at higher temperature stages. The output of the filters 482 may be connected to a high electron mobility transistor (HEMT) amplifier 486, and the output of high electron mobility transistor (HEMT) amplifier 486 is connected to OUT2.

The fourth port of the on-chip superconducting circulator 430 is connected to a 50 ohm ($\Omega$) termination point 484. In another embodiment, the port 484 may be utilized as an input line to input, e.g., a readout signal to the qubit and readout resonator system 405 or systems.

Please note that in FIGS. 4A and 4B many microwave and cryogenic components, which are commonly used in typical superconducting qubit experiments at the different stages of the dilution fridge 491, as well as the room-temperature equipment employed to control and measure these qubits, are not included in the figures for clarity and simplicity.

The quantum limited Josephson directional amplifier (JDA) 480 is connected to a directional coupler 488. The directional coupler 488 is connected to a bandpass filter 493. The output of the bandpass filter 493 is connected to the low-loss infrared filter 200. The output of the low-loss infrared filter 200 is connected to another high electron mobility transistor (HEMT) amplifier 492, such that the HEMT amplifier 492 receives and amplifies the output readout signal. The amplified readout signal is transmitted to measurement equipment 455 (via OUT1).

In FIG. 4A, a signal generator 470 is configured to generate a microwave signal at the qubit resonant frequency ($f_q$) of the superconducting qubit 410, and this qubit signal 481 ($f_q$) is input into the cavity-qubit system 405. The input qubit resonant frequency signal 481, initializes, manipulates, or controls the superconducting qubit 410. To measure or infer the state of the superconducting qubit 410, an input readout signal 485 is generated by the signal generator 470 or a different generator and sent to the cavity-qubit system 405. The input readout signal 485 is input into the readout resonator 415 at resonance (or close to resonance of the readout resonator 415). The output readout signal 450 ($f_s$) leaving the readout resonator 415, after interacting dispersively with the qubit 410, carries (quantum) information about the superconducting qubit 410 state, i.e., whether the qubit is in the ground state, excited state, and/or in a superposition of these two states. This qubit information is encoded in either the phase and/or amplitude of the output readout signal 450. The output readout signal 450 is the resonator readout signal that is output from the readout resonator 415.

The output readout signal 450 is transmitted on the microwave output transmission line 490 to the on-chip circulator 430. The on-chip circulator 430 is an integrated circuit designed to (rotationally) direct the resonator output readout signal 450 to the low-loss infrared filter 200 via the quantum limited Josephson directional amplifier (JDA) 480, the directional coupler 488, and the bandpass filter 493. The low-loss infrared filter 200 is the distributed Bragg reflector 100 integrated into a transmission line as shown in FIG. 2. This filter 200 is designed to reflect/block the infrared radiation 460 coming down the output line and originating from higher temperature stages, and thus the low-loss infrared filter 200 protects the qubit-resonator systems from this noise.

In one implementation, it is noted that the frequency of input readout signal 485 may be different than the frequency of the output readout signal 450 depending on whether the circulator 430 preserves or converts the frequency. If the circulator 430 preserves the frequency of the input readout signal 485, then the input readout signal 485 has the same frequency as the output readout signal 450). In another implementation, the circulator 430 may up-convert the frequency of output readout signal 450 such that the output readout signal 450 has a higher frequency than the input readout signal 485. In yet another implementation, the circulator 430 may down-convert the frequency of the output readout signal 450 such that output readout signal 450 has a lower frequency than the input readout signal 485.

In another implementation when the on-chip circulator 430 has 3 ports and the port to the filters 482 is not present, any excess backaction of the JDA 480 and unwanted noise coming down the output chain within the bandwidth of the on-chip circulator 430 are routed to the 50 ohm termination 484 present on the third port of the on-chip circulator 430.

When the output readout signal 450 signal or its equivalent (i.e., in case the circulator up-converts/down-converts the frequency of the processed signal) passes through the quantum limited Josephson directional amplifier 480, the quantum limited Josephson directional amplifier 480 is configured to amplify the output readout signal 450 with the lowest added noise required by quantum mechanics. The quantum limited Josephson directional amplifier 480 has lower added noise than the high electron mobility transistor amplifier 492. Quantum nondemolition (QND) measurements often require probing a quantum system (such as the cavity-qubit system 405) with a signal containing only a few microwave photons. Measuring such a weak signal with high fidelity in the microwave domain requires using a high-gain, low-noise chain of amplifiers (including the quantum limited Josephson directional amplifier 480). However, state-of-the-art amplifiers, such as those based on high electron mobility transistors (HEMT), are not quantum limited, and HEMT amplifiers may add the noise equivalent of about 20 photons at the signal frequency when referred back to the input. HEMT amplifiers can also have strong in-band and out-of-band backaction on the quantum system. In an attempt to minimize the noise added by the output chain, quantum-limited amplifiers based on parametric processes have been recently developed and used as preamplifiers before the HEMT. These quantum-limited devices, however, amplify in reflection and some of them have in addition strong reflected pump tones in-band which causes undesirable excess backaction on the quantum system. These quantum-limited devices also do not protect the measured system from backaction originating higher up in the amplification chain. Thus, nonreciprocal devices, such as circulators and isolators, are required in these measurements both to separate input from output and to protect the quantum system from unwanted backaction. The quantum limited Josephson directional amplifier 480 is directional and is intended to amplify in one direction. In one implementation, the quantum limited Josephson directional amplifier 480 comprises two nominally identical nondegenerate quantum-limited amplifiers, known as the Josephson parametric converter (JPC), coupled together through their signal and idler ports. Josephson parametric converter (JPC) is a phase preserving amplifier that adds in principle a half photon of noise at the signal frequency when referred back to the input.

Further information regarding the quantum limited Josephson directional amplifier may be found in a paper entitled "Josephson Directional Amplifier for Quantum Measurement of Superconducting Circuits", by Baleegh Abdo, Katrina Sliwa, S. Shankar, Michael Hatridge, Luigi Frunzio, Robert Schoelkopf, and Michel Devoret, in Department of Applied Physics, Yale University, New Haven, Conn. 06520, USA, (Received 25 Nov. 2013; published 22 Apr. 2014), which is herein incorporated by reference.

In another implementation, the quantum limited Josephson directional amplifier 480 may be a different Josephson amplifier which is directional and quantum limited or operates near the quantum limit. One example of such amplifier is the traveling wave parametric amplifier.

In another implementation, the quantum limited Josephson directional amplifier 480 may be a quantum limited Josephson amplifier that is not directional, i.e., working in reflection. In such a case when the quantum limited Josephson amplifier works in reflection, the on-chip circulator 430 is connected between the quantum limited Josephson amplifier 480 and the cavity-qubit system 405, in order for the resonator-qubit system 405 to be protected from any signals reflected from the amplifier 480 and also separate input from output signals propagating on the same transmission line.

FIG. 4B is a variation of the previous setup (in FIG. 4A) to illustrate an example of measurement of qubit-resonator systems in reflection according to an embodiment. In FIG. 4B, the measurement in reflection method may be more suitable for measuring one readout resonator, while the transmission method in FIG. 4A may be more beneficial when coupling several readout resonators to a common bus and multiplexing the readout. In FIG. 4B, IN1 is connected to port 1 of the circulator 430, the resonator-qubit system 405 is connected to port 2, the quantum limited amplifier 480 is connected to port 3, and the output line (OUT2) is connected to port 4. Moreover, if the isolation provided by a single stage circulator is insufficient, the quantum limited amplifier and the resonator-qubit system can be alternatively separated by two or more circulators connected in series.

Please note that FIGS. 4A and 4B do not show microwave pump lines or DC-lines that might be utilized in order to bias or operate the circulator, the quantum-limited amplifier, and/or the HEMTs. It is understood these microwave pump lines or DC-lines are connected or connectable to the system.

In FIGS. 4A and 4B, the directional coupler 488 may be a 4 port circuit where one port is coupled to the input port with predefined attenuation, the output port is coupled with no attenuation to the input port, and the last port is isolated from the input port. The ports of the directional coupler 488 are (ideally) matched, and the circuit is (ideally) lossless. Directional couplers can be realized in microstrip, stripline, and waveguide. The input IN2 is utilized to send a test signal into the directional coupler 488 through the coupled port and out of the input port in order to tune the quantum limited Josephson directional amplifier 480 and/or the lossless circulator 430 to a working point. The directional coupler 488 is shown on the right side (output side) of the quantum limited Josephson directional amplifier 480. However, as another option, the directional coupler 488 may instead be connected to the left side (input side) of the quantum limited Josephson directional amplifier 480. In that case, if the purpose of adding the directional coupler is to set the working point of the directional amplifier or verify its operation condition independently of the qubit-resonator systems, the input port of the directional coupler is to be connected to the input port of the directional amplifier, IN2 is to be connected to the coupled port of the directional coupler, and the output port of the directional coupler is to be connected to the corresponding circulator port. If on the other hand the purpose of adding the directional coupler is to set the working point of the circulator or verify its operation condition, the input port of the directional coupler would be connected to the corresponding circulator port, IN2 is to be connected to the coupled port of the directional coupler, and the output port of the directional coupler is to be connected to the input of the directional amplifier port. In any configuration, it is appreciated that the attenuation on the coupled port of the directional coupler is high enough, e.g., 20 dB, in order to prevent power leakage of the readout signal through the auxiliary input line IN2. A lossless version of the directional coupler 488 in the frequency band of interest can be implemented using a superconducting circuit.

The bandpass filter 493 is a filter that allows a band of frequencies to pass through, where the microwave frequency band encompasses the frequencies of the microwave output readout signals 450. Thus, the microwave frequency band that passes through the bandpass filter 493 should cover at least the band of output microwave signals used in the readout of the various qubits connected to the circulator 430. The microwave frequency band of the bandpass filter 493 also needs to be slightly narrower or match the frequency band of the circulator. Accordingly, the bandpass filter 493 provides protection/isolation for the qubit-cavity systems by blocking signals propagating in the unwanted/opposite direction whose frequencies fall above and below the particular microwave frequency band encompassing the microwave output readout signals 450.

According to an embodiment, the cavity-qubit system 405, the on-chip superconducting circulator 430, the quantum limited Josephson directional amplifier 480, the directional coupler 488, the bandpass filter 493, and/or the low-loss infrared filter 200 may all be formed on the same integrated chip 498. In another embodiment, the low-loss infrared filter 200 may not be included on the integrated chip 498

The integrated chip 498 may be placed in a dilution refrigerator 491. The dilution refrigerator 491 is a cryogenic device that provides continuous cooling to temperatures, e.g., as low as 2 millikelvin (mK), with no moving parts in the low-temperature region. The cooling power is provided by the heat of mixing of the Helium-3 and Helium-4 isotopes. It is considered the only continuous refrigeration method for reaching temperatures below 0.3 K.

The on-chip superconducting circulator 430 is not a commercial cryogenic circulator that is bulky and large. Commercial cryogenic circulators have insertion loss which means that the signal passing through them gets attenuated. Also, commercial cryogenic circulators use magnetic materials which are not compatible with superconducting qubits or the material of the superconducting qubits. However, the proposed on-chip superconducting circulator 430 is compatible with the superconducting qubit 410 and includes no magnetic material. By using the on-chip superconducting circulator 430, microwave connectors, coaxial lines, lossy isolators, and/or cryogenic circulators can be eliminated. One example of an on-chip superconducting circulator may be a four-port, lossless, on-chip microwave circulator using a compact design of Josephson parametric converters (JPCs) and hybrids. The JPC, which is normally used as a phase-preserving quantum-limited amplifier, is operated here in a pure conversion mode with unity photon gain. The non-reciprocity of the on-chip microwave circulator device is induced by a phase difference between the pump signals feeding two JPCs sharing a common idler port. The circulation direction in this scheme which depends on the phase difference between the pump signals feeding the two JPCs can be reversed much more rapidly than by changing the direction of the permanent magnetic field that sets the circulation direction in commercial circulators and isolators. Furthermore, since the on-chip microwave circulator device consists only of purely dispersive components and it is operated in pure frequency conversion mode (without photon gain), the circulator does not add any noise to signals it processes.

Another example of an on-chip circulator can be found in a paper entitled "On-chip superconducting microwave circulator from synthetic rotation" by Joseph Kerckhoff, Kevin Lalumiére, Benjamin J. Chapman, Alexandre Blais, and K. W. Lehnert1, dated: Feb. 24, 2015, cited as arXiv: 1502.06041 [quant-ph].

Waveguides may be utilized as the transmission lines 490 to physically connect various elements to the cavity-qubit system 405. Examples of the microwave transmission line 490 may include a microstrip, coplanar waveguide, strip line or coaxial cable, etc.

It is noted that the cavity-qubit system 405, the on-chip circulator 430, quantum limited Josephson directional amplifier 480, and bandpass filter 493 may be formed of superconducting materials. Examples of superconducting material include niobium, aluminum, niobium titanium nitride, and/or titanium nitride.

Further, the on-chip superconducting circulator 430 is configured to preserve, upconvert, and/or downconvert the frequency of the processed signal upon transmission between sequential ports (that lie in the direction of the rotation arrow). For example, for a 4 port circulator with a rotation arrow which indicates unity transmission from port 1 to 2, 2 to 3, 3 to 4, and 4 to 1 but not in the opposite direction, ports 1 and 3 of the circulator might support an equal or different frequency band than ports 2 and 4. Or more specifically, if we denote the center frequency of the frequency band supported by ports 1 and 3 as ($f_s$) and the center frequency of the frequency band supported by ports 2 and 4 ($f_i$), then in the case that $f_s=f_i$, the circulator preserves the frequency of the processed signal. However, in the case $f_s<f_i$, then the processed signal is upconverted upon transmission from port 1 to 2, and 3 to 4, but downconverted upon transmission from port 2 to 3, and 4 to 1. Likewise, in the complimentary case $f_s>f_i$, then the processed signal is downconverted upon transmission from port 1 to 2, and 3 to 4, but upconverted upon transmission from port 2 to 3, and 4 to 1. Hence, by connecting for example port 1 of such circulator to the output of the cavity-qubit systems 405 and port 2 to the input of the directional amplifier 480, then the output readout signal 450 entering the circulator through port 1 at frequency $f_s$ might or might not be equal to the frequency $f_i$ of the output readout signal 450 coming out of the circulator through port 2 and entering the directional amplifier 480.

The quantum limited Josephson directional amplifier 480 and the microwave bandpass filter 493 are both set to operate and transmit within a certain frequency band around ($f_i$) of the output readout signal 450.

In one implementation, the qubit-readout system 405 maybe be one qubit-readout system or several qubit-readout systems. For example, multiple readout resonators may be capacitively coupled to a shared microwave bus. In other words, the output line can serve several qubit-readout resonator systems as long as 1) the corresponding readout frequencies of the multiple readout resonators fall within the bandwidths of the circulator, JDA, directional coupler, bandpass filter, low-loss IR filter, and HEMT; and 2) the maximum input power of both the JDA and on-chip circulator is larger than the total power of the readout signals applied simultaneously.

According to embodiments, the readout scheme discussed herein allows measurement of superconducting qubits with high fidelity and high efficiency especially when performing a quantum nondemolition measurement of the qubit states, while at the same time provide the measured qubits with sufficient amount of protection against noise coming down the amplification chain/output line and also minimize the footprint of the necessary microwave components in the mixing chamber. In order to better understand how this readout scheme achieves these goals, a brief description is provided of the roles played by the main components in the setup. The particular role of the on-chip lossless circulator is to protect the qubits from microwave noise coming down the output line within the bandwidth of the circulator which ideally matches or overlaps the bandwidth of the readout resonators connected to one of its ports. Examples of such unwanted noise include excess backaction of the directional amplifier or noise coming back from the HEMT. The particular role of the quantum limited directional amplifier is to significantly improve the signal-to-noise ratio of the output chain compared to the case in which only the HEMT amplifier is present. In order to achieve that, the quantum limited directional amplifier does not add more noise to the processed signal than the minimum amount required by quantum mechanics. The quantum limited directional amplifier also needs to have enough power gain in order to overcome (beat) the noise added by the subsequent HEMT amplifier, and enough bandwidth to amplify the readout signals coming from the readout resonators. In addition, the requirement (but not necessity) that the quantum limited directional amplifier is directional, minimizes the amount of circulators/isolators that need to be added in between the amplifier and the qubit-readout systems in order to protect the qubits from the reflected amplified signals and allow the separation of input from output signals propagating on the same transmission lines. Consequently, this reduction in hardware minimizes the footprint of the setup and minimizes the amount of insertion loss associated with the addition of intermediate stages between the readout resonators and the quantum-limited amplifier such as off-chip circulators, transmission lines, and connectors. Hence, by pairing a lossless circulator with a quantum directional amplifier (possibly) on the same chip, embodiments reduce to a minimum the amount of loss experienced by the readout signal between the readout systems and the quantum-limited amplifier, and consequently achieve a high efficiency measurement (i.e., minimize the loss of quantum information carried by the readout signal). The particular role of the microwave bandpass filter and the low-loss infrared filter is to allow the transmission of the readout signals up the output line with minimum attenuation (i.e., minimum degradation of the signal-to-noise ratio), that is in order to maintain high efficiency and high fidelity measurements of the qubits, while at the same time shield the directional amplifier, circulator, and qubits coupled to readout resonators from certain out-of-band noise in the microwave and infrared domains respectively. Furthermore, the benefit of integrating all or most of these elements on the same chip with or without the qubit-cavity systems and infrared filter makes this readout scheme highly suitable for scalable architectures of quantum processors.

Figure 5A:
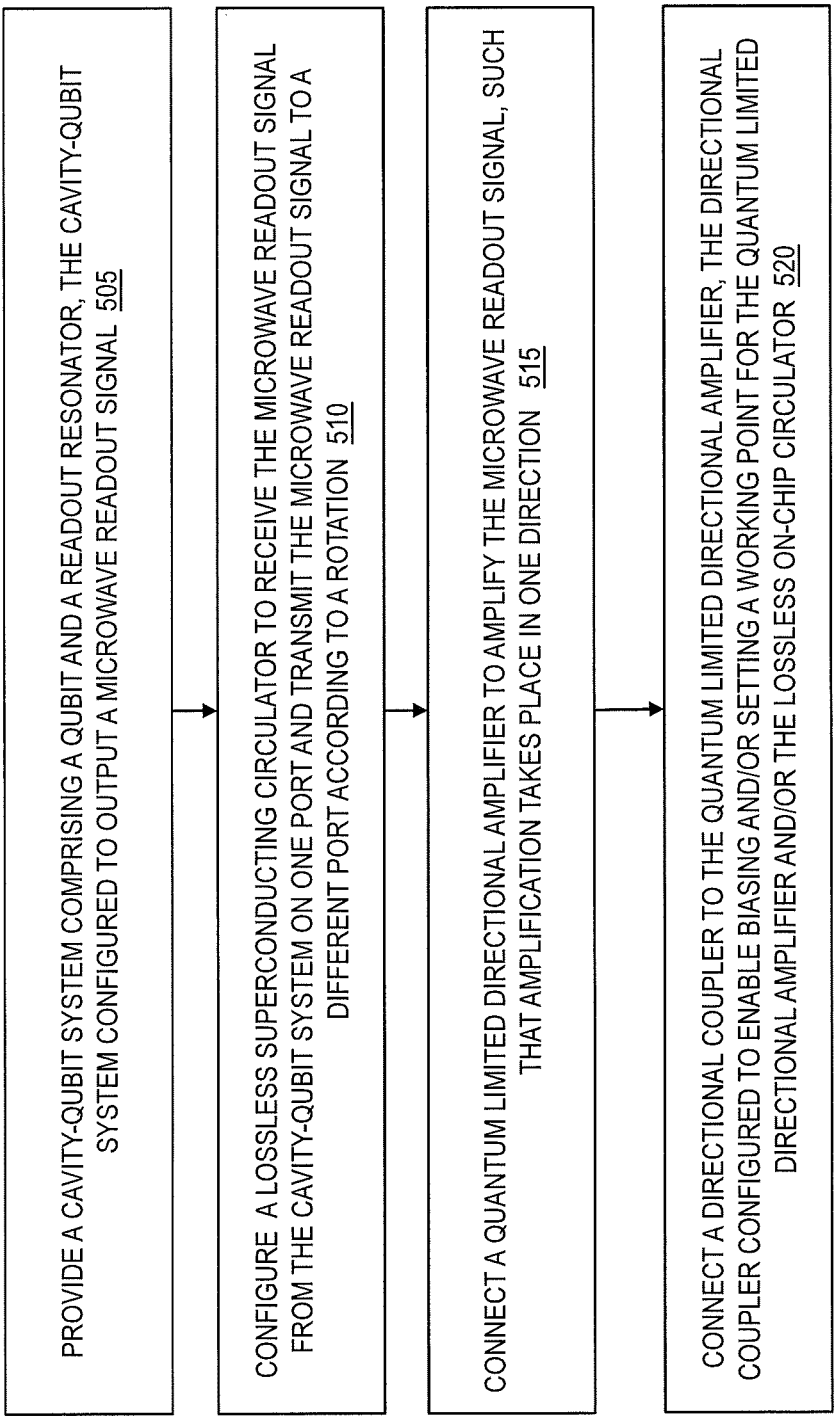
FIGS. 5A and 5B together illustrate a flow chart of a method of configuring the microwave apparatus according to an embodiment.
Figure 5B:
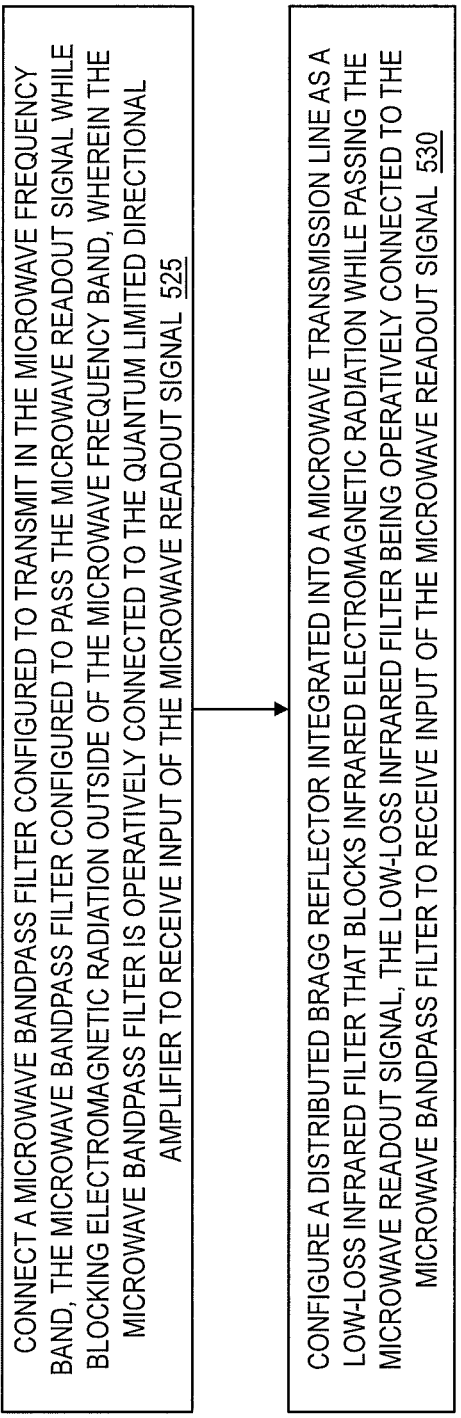

Now turning to FIGS. 5A and 5B, a flow chart 500 of method for configuring the microwave apparatus 400 is provided according to an embodiment.

At block 505, the cavity-qubit system 405 (or cavity-qubit systems coupled for example to a common bus) comprising the superconducting qubit 410 (or qubits) and the readout resonator 415 (or resonators) is provided, and the cavity-qubit system 405 (or systems) is configured to output a microwave output readout signal 450 (or signals).

At block 510, the lossless superconducting circulator 430 is configured to receive the microwave output readout signal 450 from the cavity-qubit system 405 on one port and transmit on a different port the microwave output readout signal 450 (which might have a different frequency when frequency conversion has been performed by the circulator 430) according to a rotation.

At block 515, the quantum limited Josephson directional amplifier 480 is configured to amplify the microwave output readout signals 450, such that amplification takes place in one direction.

At block 520, the directional coupler 488 is connected to the quantum limited directional amplifier 480, and the directional coupler 488 is configured to enable biasing and/or to set a working point for the quantum limited directional amplifier 480 and/or the circulator.

At block 525, the microwave bandpass filter 493 is connected and configured to transmit in the microwave frequency band, and the microwave bandpass filter 493 is configured to pass the microwave output readout signal 450 while blocking electromagnetic radiation outside of the microwave readout frequency band. The microwave bandpass filter 493 is operatively connected to the quantum limited directional amplifier 480 to receive input of the microwave output readout signal 450.

At block 530, the distributed Bragg reflector integrated into a transmission line is configured as a low-loss infrared filter 200 that blocks infrared electromagnetic radiation 460 while passing the microwave output readout signal 450, and the low-loss infrared filter is operatively connected to the microwave bandpass filter 493 to receive input of the microwave output readout signal 450.

The integrated circuit chip 498 comprises the cavity-qubit system 405, the on-chip superconducting circulator 430, the quantum limited Josephson directional amplifier 480, the directional coupler 488, the microwave bandpass filter 493, and the low-loss infrared filter 200. The integrated circuit chip 498 is placed in a dilution refrigerator 491.

The microwave apparatus 400 includes a high electron mobility transistor amplifier 492. The high electron mobility transistor amplifier 492 is operatively connected to the low-loss infrared filter 200 to receive input of the microwave output readout signal 450 with the infrared radiation 460 coming in the opposite direction filtered out.

The directional coupler 488 is configured to send a microwave tone (via IN2) to the quantum limited directional amplifier 480 to set the working point for the quantum limited directional amplifier 480. The microwave tone can also be configured to pass through the quantum limited directional amplifier 480 to the on-chip superconducting circulator 430. The on-chip superconducting circulator 430 is configured to receive the microwave tone and transmit it to a next port (e.g., connected to filters 482 for a 4 port circulator or connected to the 50Ω termination port 484 for a 3 port circulator) that is not connected to the cavity-qubit system 405.

The quantum limited directional amplifier 480 comprises one or two Josephson parametric converters (JPCs) and hybrids. The on-chip superconducting circulator 430 comprises Josephson parametric converters (JPCs) and hybrids.

The distributed Bragg reflector in the low-loss infrared filter 200 comprises a unit cell 110 of at least two different dielectric layers D1 and D2. The unit cell repeats to have a total of N dielectric layers 225. The distributed Bragg reflector in the low-loss infrared filter 200 comprises a first dielectric layer D1 and a second dielectric layer D2 adjacent to the first dielectric layer D1. The first dielectric layer D1 has a first dielectric constant $\in_1$. The second dielectric layer D2 has a second dielectric constant $\in_2$ different from the first dielectric constant $\in_1$. The first dielectric layer D1 has a first thickness $t_1$, and the second dielectric layer D2 has a second thickness $t_2$.

The low-loss infrared filter 200 comprises a center conductor strip line 210 formed through the first dielectric layer and the second dielectric layer. The low-loss infrared filter 200 comprises an outer conductor 205 encompassing the first dielectric layer D1 and the second dielectric layer D2, and the center conductor strip line extends through the outer conductor in a lengthwise direction. The low-loss infrared filter 200 comprises a first connector 350A and a second connector 250B, both connected to opposite ends of the center conductor strip line 210 in the lengthwise direction. An outer conductor of the first and second connectors 250A, 250B connects to the outer conductor of the low-loss infrared filter 200.

Figure 6:
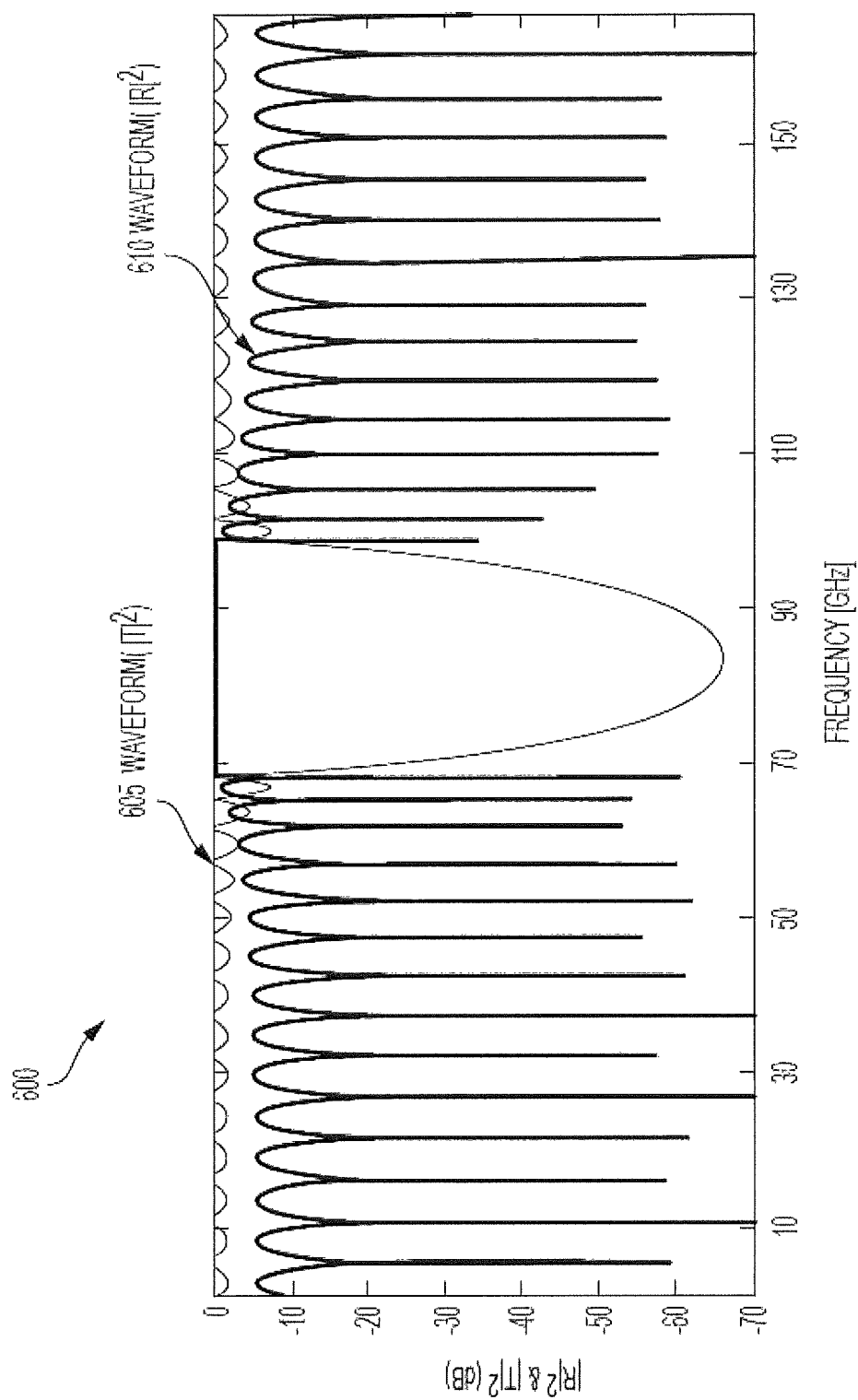
FIG. 6 is a graph illustrating a calculated reflection waveform and transmission waveform versus frequency of one example of a low-loss infrared filter according to an embodiment.

FIG. 6 is a graph 600 illustrating a calculated waveform 610 for the reflection R and a waveform 605 for the transmission T of the low-loss infrared filter 200 comprising the distributed Bragg reflector 100 according to an embodiment. An example design for the distributed Bragg reflector and setup is discussed but it should be appreciated that the design may be adjusted for different blackbody radiation temperatures and/or to reflect/block different frequency bands.

In this design example, the low-loss infrared filter 200 is designed to reflect/block an infrared frequency band having a center frequency at $f_R=83$ gigahertz (GHz) whose wavelength in vacuum is given by $\lambda_R=c/f_R$, where c is the velocity of light in vacuum. The reflected infrared frequency band may be about 30 GHz. In the graph 600, the x-axis depicts the frequency in GHz. The y-axis depicts in decibels (dB) the power reflection parameter $|R|^2$ and the power transmission parameter $|T|^2$ of the low-loss infrared filter 200.

In this design example, the dielectric layers D1 and D2 are SiO ($\in=3.9$) and Si ($\in=11.8$), respectively. The distributed Bragg reflector 100 has N total layers where N=30, has thickness $t_1=456$ μm (for dielectric layer D1), and has thickness $t_2=262$ μm (for dielectric layer D2). The length of the center conductor 210 corresponds to the thickness of the total N dielectric layers.

In FIGS. 4A and 4B, the microwave output side is designed to have all elements with a characteristic impedance of 50Ω in the range 1-15 GHz. Accordingly, the experimenters design the low-loss infrared filter 200, cast in the form of a stripline loaded with a distributed Bragg reflector, to have a matching characteristic impedance of $Z_0=50Ω$. The effective dielectric constant $\in_{eff}$ of the dielectric layers D1 and D2 as seen by microwave signals in the range 1-15 GHz is about 6.8 which can be approximately estimated as the weighted average of the dielectric constants of the two alternating dielectric layers $\in_{eff} \approx (\in_1 t_1 + \in_2 t_2)/(t_1+t_2)$. Regarding the dimensions (inside) of the copper box (outer conductor) 205—which roughly yields a characteristic impedance of $Z_0=50Ω$ in the frequency range of interest—the width 2a of each of the dielectric layers D1, D2 corresponds to a=12.5 mm such that 2a=25 mm, and the height 2b of each of the dielectric layers D1, D2 corresponds to b=2 mm such that 2b=4 mm. The width W of the center conductor 210 (e.g., copper stripline) is W=1.14 mm and the length L of the center conductor is L=10.77 mm.

The transmission waveform ($|T|^2$) 605 shows that the low-loss infrared filter 200 has more than 60 dB attenuation at the center frequency 83 GHz; which means that the transmitted power through the low-loss infrared filter 200 at the center frequency 83 GHz is reduced by a factor of more than $10^6$. The waveform also shows that the device effectively blocks transmission around the center frequency within the band 68-98 GHz (which corresponds to $|T|^2 \leq 0.5$ in linear scale, and $|T|^2 \leq -3$ dB in logarithmic scale). Furthermore, the transmission in the microwave band of interest 5-15 GHz ranges is between 0 to −1.4 dB, which means that readout signals that fall within this band experience, in general, very little attenuation when passing through the device. In particular, those readout signals have frequencies that correspond to transmission parameters that are very close to 0 dB within that band.

The reflection waveform ($|R|^2$) 610 shows that the low-loss infrared filter 200 has 0 dB reflection (unity reflection) at the center frequency 83 GHz, and almost unity reflection in the IR band 68-98 GHz (which corresponds to $|R|^2 \geq 0.5$ in linear scale, and $|R|^2 \geq -3$ dB in logarithmic scale), thus effectively blocking power transmission within this band.

It will be noted that various microelectronic device fabrication methods may be utilized to fabricate the components/elements discussed herein as understood by one skilled in the art. In superconducting and semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of configuring an apparatus, the method comprising:
   providing an outer conductor with a distributed Bragg reflector in the outer conductor; and
   providing a center conductor through the distributed Bragg reflector, such that a low-loss filter is formed by the outer conductor, the distributed Bragg reflector, and the center conductor, wherein the center conductor is encircled by material forming the distributed Bragg reflector;

wherein the distributed Bragg reflector comprises a unit cell of at least two different dielectric layers, the unit cell repeats such that one unit cell is formed adjacent to a next unit cell continuously in the redistributed Bragg reflector.

2. The method of claim 1, wherein the low-loss filter is configured to block infrared electromagnetic radiation while passing a microwave signal;

wherein the center conductor is continuous through a continuous repetition of the unit cell.

3. The method of claim 1, wherein a repetition of the one unit cell adjacent to the next unit cell is continuous throughout the distributed Bragg reflector without interruption.

4. The method of claim 3, wherein the unit cell repeats to have a total of N dielectric layers.

5. The method of claim 1, wherein the distributed Bragg reflector comprises a first dielectric layer and a second dielectric layer adjacent to the first dielectric layer.

6. The method of claim 5, wherein the first dielectric layer has a first dielectric constant.

7. The method of claim 6, wherein the second dielectric layer has a second dielectric constant different from the first dielectric constant.

8. The method of claim 1, wherein the low-loss filter comprises a first connector and a second connector, both connected to opposite ends of the low-loss filter.

9. The method of claim 2, wherein the low-loss filter is configured to receive the microwave signal as a microwave readout signal.

10. The method of claim 9, wherein the microwave readout signal includes quantum information.

11. An apparatus comprising:

an outer conductor housing a distributed Bragg reflector in the outer conductor; and a center conductor through the distributed Bragg reflector, such that a low-loss filter is formed by the outer conductor, the distributed Bragg reflector, and the center conductor, wherein the center conductor is encircled by material forming the distributed Bragg reflector;

wherein the distributed Bragg reflector comprises a unit cell of at least two different dielectric layers, the unit cell repeats such that one unit cell is formed adjacent to a next unit cell continuously in the redistributed Bragg reflector.

12. The apparatus of claim 11, wherein the low-loss filter is configured to block infrared electromagnetic radiation while passing a microwave signal.

13. The apparatus of claim 11, wherein a repetition of the one unit cell adjacent to the next unit cell is continuous throughout the distributed Bragg reflector without interruption.

14. The apparatus of claim 13, wherein the unit cell repeats to have a total of N dielectric layers.

15. The apparatus of claim 11, wherein the distributed Bragg reflector comprises a first dielectric layer and a second dielectric layer adjacent to the first dielectric layer.

16. The apparatus of claim 15, wherein the first dielectric layer has a first dielectric constant.

17. The apparatus of claim 16, wherein the second dielectric layer has a second dielectric constant different from the first dielectric constant.

18. The apparatus of claim 11, wherein the low-loss filter comprises a first connector and a second connector, both connected to opposite ends of the low-loss filter.

19. The apparatus of claim 12, wherein the low-loss filter is configured to receive the microwave signal as a microwave readout signal.

20. The apparatus of claim 19, wherein the microwave readout signal includes quantum information.

* * * * *